United States Patent
Kukita et al.

(10) Patent No.: US 11,459,496 B2
(45) Date of Patent: Oct. 4, 2022

(54) SLURRY, POLISHING SOLUTION PRODUCTION METHOD, AND POLISHING METHOD

(71) Applicant: Showa Denko Materials Co., Ltd., Tokyo (JP)

(72) Inventors: Tomomi Kukita, Tokyo (JP); Tomohiro Iwano, Tokyo (JP); Takaaki Matsumoto, Tokyo (JP); Tomoyasu Hasegawa, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 0 days.

(21) Appl. No.: 17/262,633

(22) PCT Filed: Sep. 25, 2018

(86) PCT No.: PCT/JP2018/035443
§ 371 (c)(1),
(2) Date: Jan. 22, 2021

(87) PCT Pub. No.: WO2020/021731
PCT Pub. Date: Jan. 30, 2020

(65) Prior Publication Data
US 2021/0261820 A1 Aug. 26, 2021

(30) Foreign Application Priority Data

Jul. 26, 2018 (WO) .................. PCT/JP2018/028105

(51) Int. Cl.
*C09K 3/14* (2006.01)
*C09G 1/02* (2006.01)
*H01L 21/3105* (2006.01)
*B24B 37/04* (2012.01)
*H01L 21/66* (2006.01)
*H01L 21/304* (2006.01)
*C01F 17/235* (2020.01)

(52) U.S. Cl.
CPC .......... *C09K 3/1454* (2013.01); *B24B 37/042* (2013.01); *C09G 1/02* (2013.01); *C09K 3/1409* (2013.01); *H01L 21/304* (2013.01); *H01L 21/31053* (2013.01); *H01L 22/26* (2013.01); *C01F 17/235* (2020.01); *C01P 2002/85* (2013.01); *C01P 2004/64* (2013.01); *C01P 2006/40* (2013.01)

(58) Field of Classification Search
None
See application file for complete search history.

(56) References Cited

U.S. PATENT DOCUMENTS

| | | | |
|---|---|---|---|
| 5,543,126 A | 8/1996 | Ota | |
| 6,939,211 B2* | 9/2005 | Taylor | ...................... C09G 1/02 |
| | | | 257/E21.23 |
| 7,112,123 B2 | 9/2006 | Fang | |
| 2004/0065022 A1* | 4/2004 | Machii | ...................... C09G 1/02 |
| | | | 51/309 |
| 2004/0152309 A1 | 8/2004 | Carter | |
| 2005/0119360 A1 | 6/2005 | Kawakami | |
| 2007/0044385 A1 | 3/2007 | Yamada | |
| 2011/0275285 A1 | 11/2011 | Satou | |
| 2012/0100718 A1 | 4/2012 | Minami | |
| 2012/0129346 A1 | 5/2012 | Ryuzaki | |
| 2012/0299158 A1 | 11/2012 | Shinoda | |
| 2012/0329371 A1 | 12/2012 | Iwano | |
| 2013/0161285 A1 | 6/2013 | Li | |
| 2015/0140904 A1 | 5/2015 | Iwano | |
| 2015/0232704 A1 | 8/2015 | Akutsu | |
| 2015/0232705 A1 | 8/2015 | Kachi | |
| 2016/0024351 A1 | 1/2016 | Yoshida | |
| 2016/0108284 A1 | 4/2016 | Yoshizaki | |

(Continued)

FOREIGN PATENT DOCUMENTS

| | | |
|---|---|---|
| CN | 103189457 | 7/2013 |
| CN | 103339219 | 10/2013 |

(Continued)

OTHER PUBLICATIONS

"Wikipedia, "N-vinylpyrrolidone" via https://en.wikipedia.org/wiki/N-Vinylpyrrolidone", 2020, p. 1-p. 3 (cited in Office Action dated Mar. 9, 2021 in U.S. Appl. No. 16/981,589).

"Wikipedia, "Poly(N-vinylacetamide)" via https://en.wikipedia.org/wiki/Poly(N-vinylacetamide)", 2019, p. 1-p. 2 (cited in Office Action dated Mar. 9, 2021 in U.S. Appl. No. 16/981,589).

"Wikipedia, "Polyethylene glycol" via https://en.wikipedia.org/wiki/Polyethylene_glycol", 2021, p. 1-p. 11 (cited in Office Action dated Mar. 9, 2021 in U.S. Appl. No. 16/981,589).

"Wikipedia, "Tartaric acid" via https://en.wikipedia.org/wiki/Tartaric_acid", 2021, p. 1-p. 9 (cited in Office Action dated Mar. 9, 2021 in U.S. Appl. No. 16/981,589).

International Search Report dated Dec. 11, 2018, for International Application No. PCT/JP2018/035456, together with English language translation.

(Continued)

*Primary Examiner* — Stephanie P Duclair
(74) *Attorney, Agent, or Firm* — Fitch, Even, Tabin & Flannery, L.L.P.

(57) ABSTRACT

A slurry containing abrasive grains and a liquid medium, in which the abrasive grains include first particles and second particles in contact with the first particles, the first particles contain cerium oxide, the second particles contain a cerium compound, and an Rsp value calculated by Formula (1) below is 1.60 or more:

$$Rsp=(Tb/Tav)-1 \qquad (1)$$

[in the formula, Tav represents a relaxation time (unit: ms) obtained by pulsed NMR measurement of the slurry in a case where a content of the abrasive grains is 2.0% by mass, and Tb represents a relaxation time (unit: ms) obtained by pulsed NMR measurement of a supernatant solution obtained when the slurry is subjected to centrifugal separation for 50 minutes at a centrifugal acceleration of $2.36 \times 10^5$ G in a case where the content of the abrasive grains is 2.0% by mass.]

18 Claims, No Drawings

(56) References Cited

U.S. PATENT DOCUMENTS

| | | |
|---|---|---|
| 2016/0137881 A1 | 5/2016 | Oota |
| 2016/0319159 A1 | 11/2016 | Minami |
| 2017/0183537 A1 | 6/2017 | Yoon |
| 2017/0183538 A1 | 6/2017 | Kwon |
| 2017/0292039 A1 | 10/2017 | Sato |
| 2018/0043497 A1 | 2/2018 | Hanano |
| 2018/0072917 A1 | 3/2018 | Kobayashi |
| 2019/0211245 A1 | 7/2019 | Choi |
| 2019/0256742 A1* | 8/2019 | Suzuki ............. C09K 3/14 |
| 2020/0299544 A1 | 9/2020 | Hanano |
| 2021/0189175 A1 | 6/2021 | Gagliardi |

FOREIGN PATENT DOCUMENTS

| | | |
|---|---|---|
| CN | 104334675 | 2/2015 |
| CN | 105895518 | 8/2016 |
| CN | 108010878 | 5/2018 |
| JP | H08022970 | 1/1996 |
| JP | H10106994 | 4/1998 |
| JP | 2005513765 | 5/2005 |
| JP | 2006249129 | 9/2006 |
| JP | 2007318072 | 12/2007 |
| JP | 2008112990 | 5/2008 |
| JP | 2009290188 | 12/2009 |
| JP | 2010153781 | 7/2010 |
| JP | 2011518098 | 6/2011 |
| JP | 4941430 | 5/2012 |
| JP | 2012186339 | 9/2012 |
| JP | 2013540851 | 11/2013 |
| JP | 201593932 | 5/2015 |
| JP | 2015-137297 A | 7/2015 |
| JP | 2016029123 | 3/2016 |
| JP | 2016538359 | 12/2016 |
| JP | 201752858 | 3/2017 |
| JP | 2017203076 | 11/2017 |
| JP | 2018044046 | 3/2018 |
| KR | 101737938 | 5/2017 |
| KR | 1020180029888 | 3/2018 |
| TW | 201518489 | 5/2015 |
| TW | 201518492 | 5/2015 |
| TW | 201525118 | 7/2015 |
| TW | 201610126 | 3/2016 |
| TW | 201816060 | 5/2018 |
| WO | 97029510 | 8/1997 |
| WO | 02067309 | 8/2002 |
| WO | 2008146641 | 12/2008 |
| WO | 2009131133 | 10/2009 |
| WO | 2010143579 | 12/2010 |
| WO | 2012070541 | 5/2012 |
| WO | 2012070542 | 5/2012 |
| WO | 2012070544 | 5/2012 |
| WO | 2013125441 | 8/2013 |
| WO | 2014199739 | 12/2014 |
| WO | 2014208414 | 12/2014 |
| WO | 2015052988 | 4/2015 |
| WO | 2015098197 | 7/2015 |
| WO | 2016006553 | 1/2016 |
| WO | 2016143797 | 9/2016 |
| WO | 201743139 | 3/2017 |
| WO | 2018/012174 | * 1/2018 |
| WO | 2018012174 | 1/2018 |
| WO | 2018048068 | 3/2018 |

OTHER PUBLICATIONS

Written Opinion of the International Searching Authority dated Dec. 11, 2018, for International Application No. PCT/JP2018/035456, together with English language translation.

International Search Report dated Aug. 1, 2019, for International Application No. PCT/JP2018/035441, together with English language translation.

Written Opinion of the International Searching Authority dated Aug. 1, 2019, for International Application No. PCT/JP2018/035441, together with English language translation.

International Search Report dated Dec. 25, 2018, for International Application No. PCT/JP2018/035443, together with English language translation.

Written Opinion of the International Searching Authority dated Dec. 25, 2018, for International Application No. PCT/JP2018/035443, together with English language translation.

International Search Report dated Sep. 24, 2019, for International Application No. PCT/JP2019/028712, together with English language translation.

Written Opinion of the International Searching Authority dated Sep. 27, 2019, for International Application No. PCT/JP2019/028712, together with English language translation.

"Glyceric acid," https://en.wikipedia.org/wiki/Glyceric_acid, 2021, p. 1-p. 2 (Cited in Office Action dated May 10, 2021 in U.S. Appl. No. 16/981,589).

"Glycolic Acid," https://en.wikipedia.org/wiki/Glycolic_acid, 2021, p. 1-p. 5 (Cited in Office Action dated May 10, 2021 in U.S. Appl. No. 16/981,589).

"Lactic acid," https://en.wikipedia.org/wiki/Lactic_acid, 2021, p. 1-p. 11 (Cited in Office Action dated May 10, 2021 in U.S. Appl. No. 16/981,589).

Merrian Webster, Definition of "have," https://www.merriam-webster.com/dictionary/have, 2021, p. 1-p. 14 (Cited in Office Action dated May 10, 2021 in U.S. Appl. No. 16/981,589).

A. Solt, "13.1 Amino Acids," Chemistry Libre Texts, Chem.Libretext.org, 2021 (Cited in Office Action dated May 25, 2021 in U.S. Appl. No. 16/981,573).

Merricks et al., "Evolution and Revolution of Cerium Oxide Slurries in CMP," Ferro Electronic Material Systems, 2015, pp. 1-6 (Cited in Office Action dated Mar. 10, 2022 in U.S. Appl. No. 16/981,560).

* cited by examiner

SLURRY, POLISHING SOLUTION PRODUCTION METHOD, AND POLISHING METHOD

CROSS-REFERENCE TO RELATED APPLICATIONS

This application is a U.S. national phase application filed under 35 U.S.C. § 371 of International Application No. PCT/JP2018/035443, filed Sep. 25, 2018, designating the United States, which claims priority from International Application No. PCT/JP2018/028105, filed Jul. 26, 2018, which are hereby incorporated herein by reference in their entirety.

TECHNICAL FIELD

The present invention relates to a slurry, a method for producing a polishing liquid, and a polishing method.

BACKGROUND ART

In the manufacturing steps for semiconductor elements of recent years, the importance of processing technologies for density increase and micronization is increasing more and more. CMP (Chemical mechanical polishing) technology, which is one of the processing technologies, has become an essential technology for the formation of a shallow trench isolation (hereinafter, referred to as "STI"), flattening of a pre-metal insulating material or an interlayer insulating material, formation of a plug or an embedded metal wiring, and the like in the manufacturing steps for semiconductor elements.

Regarding polishing liquids that are most commonly used, for example, silica-based polishing liquids containing silica (silicon oxide) particles such as fumed silica and colloidal silica as abrasive grains are mentioned. Silica-based polishing liquids have a feature of high flexibility of use, and by appropriately selecting the content of abrasive grains, pH, additives, and the like, polishing of a wide variety of materials can be achieved regardless of whether the material is an insulating material or an electroconductive material.

Meanwhile, as a polishing liquid mainly used for insulating materials such as silicon oxide, a demand for a polishing liquid containing cerium compound particles as abrasive grains is also increasing. For example, a cerium oxide-based polishing liquid containing cerium oxide particles as abrasive grains can polish silicon oxide at a high rate even when the abrasive grain content is lower than that in the silica-based polishing liquid (for example, see Patent Literatures 1 and 2 described below).

CITATION LIST

Patent Literature

Patent Literature 1: Japanese Unexamined Patent Publication No. H10-106994
Patent Literature 2: Japanese Unexamined Patent Publication No. H08-022970
Patent Literature 3: Japanese Unexamined Patent Publication No. 2006-249129
Patent Literature 4: International Publication WO 2012/070544

SUMMARY OF INVENTION

Technical Problem

Incidentally, in recent years, in the manufacturing steps for semiconductor elements, it is required to achieve further micronization of wiring, and polishing scratches generated at the time of polishing are becoming problematic. That is, when many coarse particles exist at the time of polishing, polishing scratches generated at the time of polishing tend to increase. In this regard, it is required to reduce coarse particles in a polishing liquid and a slurry provided for producing a polishing liquid. As the method of removing coarse particles, a precipitation separation method, liquid cyclone, filtration, and the like are studied. From the viewpoint that influence on characteristics of the polishing liquid and the slurry is small and the viewpoint that reproducibility is excellent, there is a tendency that filtration is carried out.

However, in a conventional cerium oxide-based polishing liquid, a low removal rate (capture efficiency) of coarse particles in filtration becomes problematic. In this regard, in order to increase the removal rate of coarse particles, a method of decreasing a pore size of a filter is considered. However, in a case where the pore size of the filter is too small, there is a problem in that the removal rate of coarse particles is decreased due to clogging or a problem in that particle size distribution before and after filtration is changed due to particles adhering to a filtering material so as to decrease the polishing rate. From such reasons, there is a limit to adjust the removal rate of coarse particles by selection of a filter (such as adjustment of the pore size of a filter).

The present invention is directed to solve the problems described above, and an object of the present invention is to provide a slurry capable of obtaining an excellent removal rate for coarse particles in filtration. Furthermore, another object of the present invention is to provide a method for producing a polishing liquid by using the above-described slurry. Further, still another object of the present invention is to provide a polishing method using a polishing liquid obtained by the above-described method for producing a polishing liquid.

Solution to Problem

A slurry of an aspect of the present invention is a slurry containing abrasive grains and a liquid medium, in which the abrasive grains include first particles and second particles in contact with the first particles, the first particles contain cerium oxide, the second particles contain a cerium compound, and an Rsp value calculated by Formula (1) below is 1.60 or more:

$$Rsp = (Tb/Tav) - 1 \qquad (1)$$

[in the formula, Tav represents a relaxation time (unit: ms) obtained by pulsed NMR measurement of the slurry in a case where a content of the abrasive grains is 2.0% by mass, and Tb represents a relaxation time (unit: ms) obtained by pulsed NMR measurement of a supernatant solution obtained when the slurry is subjected to centrifugal separation for 50 minutes at a centrifugal acceleration of $2.36 \times 10^5$ G in a case where the content of the abrasive grains is 2.0% by mass.]

According to the slurry of the aspect of the present invention, an excellent removal rate of coarse particles in filtration can be obtained. According to such a slurry, by removing coarse particles with filtration, it is possible to reduce polishing scratches generated at the time of polishing.

A method for producing a polishing liquid of another aspect of the present invention includes a step of filtering the aforementioned slurry. According to such a method for producing a polishing liquid, a polishing liquid capable of reducing polishing scratches generated at the time of polishing can be obtained.

A polishing method of still another aspect of the present invention includes a step of polishing a surface to be polished by using a polishing liquid obtained by the aforementioned method for producing a polishing liquid. According to such a polishing method, polishing scratches generated at the time of polishing can be reduced.

Advantageous Effects of Invention

According to the present invention, it is possible to provide a slurry capable of obtaining an excellent removal rate of coarse particles in filtration. Furthermore, according to the present invention, it is possible to provide a method for producing a polishing liquid by using the above-described slurry. Further, according to the present invention, it is possible to provide a polishing method using a polishing liquid obtained by the above-described method for producing a polishing liquid. According to the present invention, it is possible to provide use of a slurry or a polishing liquid in polishing of silicon oxide.

DESCRIPTION OF EMBODIMENTS

Hereinafter, embodiments of the present invention will be described in detail. However, the present invention is not limited to the following embodiments.

Definition

In the present specification, a numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage can be arbitrarily combined with the upper limit value or the lower limit value of the numerical range of another stage. In the numerical ranges that are described in the present specification, the upper limit value or the lower limit value of the numerical value range may be replaced with the value shown in the examples. "A or B" may include either one of A and B, and may also include both of A and B. Materials listed as examples in the present specification can be used singly or in combinations of two or more, unless otherwise specifically indicated. In the present specification, when a plurality of substances corresponding to each component exist in the composition, the content of each component in the composition means the total amount of the plurality of substances that exist in the composition, unless otherwise specified. The term "step" includes not only an independent step but also a step by which an intended action of the step is achieved, though the step cannot be clearly distinguished from other steps.

As described later, a slurry and a polishing liquid of the present embodiment contain abrasive grains. The abrasive grains are also referred to as "abrasive particles"; however, in the present specification, the term "abrasive grains" is used. Abrasive grains are generally solid particles, and it is considered that at the time of polishing, an object to be removed is removed by the mechanical action (physical action) of the abrasive grains and the chemical action of the abrasive grains (mainly the surface of the abrasive grains); however, it is not limited to this.

The term "polishing liquid" (abrasive) is defined as a composition to be brought into contact with a surface to be polished, at the time of polishing. The term "polishing liquid" itself does not at all limit the components that are contained in the polishing liquid.

The weight average molecular weight in the present specification can be measured, for example, by a gel permeation chromatography method (GPC) under the following conditions using a calibration curve of standard polystyrene.

Instrument used: Hitachi L-6000 Model [manufactured by Hitachi, Ltd.]
Column: Gel-Pak GL-R420+Gel-Pak GL-R430+Gel-Pak GL-R440 [manufactured by Hitachi Chemical Co., Ltd., trade names, three columns in total]
Eluent: tetrahydrofuran
Measurement temperature: 40° C.
Flow rate: 1.75 mL/min
Detector: L-3300RI [manufactured by Hitachi, Ltd.]

The "coarse particles" indicate particulate substances that are significantly large in particle size distribution of the abrasive grains in the slurry or the polishing liquid. Materials for the coarse particles are not particularly limited, and examples thereof include coarse crystals or particle aggregates, foreign substances mixed from the outside, and complexes thereof. The shape of the coarse particles is not particularly limited, may be a spherical shape, a rod shape, or the like, may be a shape having a large aspect ratio, and may be a shape having unevenness on the surface. The lower limit of the size (particle size) of the coarse particles is, for example, 3 μm. However, the lower limit of the size of the coarse particles may be, for example, 0.5 μm, 1 μm, 2 μm, and the like as long as an excellent removal rate of the coarse particles is obtained.

Slurry, Polishing Liquid, and Production Methods Therefor

The slurry of the present embodiment contains abrasive grains and a liquid medium as essential components. The abrasive grains include composite particles including first particles and second particles in contact with the first particles. The first particles contain cerium oxide and the second particles contain a cerium compound. In the slurry of the present embodiment, an Rsp value calculated by Formula (1) below is 1.60 or more:

$$Rsp=(1/Tav-1/Tb)\times(Tb)=(Tb/Tav)-1 \qquad (1)$$

[in the formula, Tav represents a relaxation time (unit: ms) obtained by pulsed NMR measurement of the slurry in a case where a content of the abrasive grains is 2.0% by mass, and Tb represents a relaxation time (unit: ms) obtained by pulsed NMR measurement of a supernatant solution obtained when the slurry is subjected to centrifugal separation for 50 minutes at a centrifugal acceleration of $2.36\times10^5$ G in a case where the content of the abrasive grains is 2.0% by mass.]

By filtering the slurry of the present embodiment, an excellent removal rate of coarse particles can be obtained. According to such a slurry, by removing coarse particles with filtration, it is possible to reduce polishing scratches generated at the time of polishing. In a case where the removal rate of coarse particles is large, the number of coarse particles tends to be easily decreased, and polishing scratches can be effectively reduced. The reasons why an excellent removal rate of coarse particles is obtained in this way are, for example, the reasons to be as follows. However, the reasons are not limited to the reasons to be as follows.

That is, in a case where the second particles containing a cerium compound is in contact with the first particles containing cerium oxide, attractive interaction between particles is speculated to be generated. Such interaction is not particularly limited, and examples thereof include electrostatic attraction, covalent bond, van der Waals force, dipole-dipole interaction, hydrophobic bond, hydrogen bond, and depletion effect caused by a difference in concentration between polymeric molecules or nanoparticles. It has been considered that, in a conventional slurry, the aforementioned interaction causes the aggregation of particles and causes coarse particles to increase.

On the other hand, the composite particles in the present embodiment can maintain a dispersion state even in a case where interaction is generated. The reason for this is speculated that repulsive interaction between the second particles is generated. That is, other second particles (such as particles not in contact with the first particles) are difficult to approach the second particles in contact with the first particles. Therefore, it is speculated that new adsorption of the second particles is suppressed, and thus coarse aggregates are not formed. It is speculated that, since the repulsive interaction between the second particles is sufficiently larger than the attractive interaction between the first particles and the second particles, the composite particles in the present embodiment can maintain a dispersion state. The aforementioned repulsive interaction is not particularly limited, and examples thereof include electrostatic repulsive force, osmotic pressure, and steric repulsion by a surface adsorption layer.

On the other hand, regarding the coarse particles, it is speculated that a balance between the conflicting interactions is different from that in the composite particles. Here, it has been known that the attractive interaction (such as van der Waals force) inevitably acting between particles increases as the particle size increases. Therefore, regarding the coarse particles having a large particle size, other particles are easily adsorbed, and the aggregation suppression effect based on the repulsive interaction between the second particles is hardly expressed. That is, even if the coarse particles are covered with the second particles, the second particles can be consecutively adsorbed. Therefore, it is speculated that, when the first particles, the second particles, or aggregates thereof are adsorbed to the coarse particles, coarse particles having a large particle size are formed. In this way, the particle size of the coarse particles is selectively increased, and thus it is speculated that the removal rate of the coarse particles is easily increased by capturing the coarse particles by the filtering material.

Further, in the present embodiment, the Rsp value is the above-described predetermined value or more, and thereby, as described in the following reason, an excellent removal rate of coarse particles can be obtained.

In the pulsed NMR measurement, a time (relaxation time) until nuclear spin having obtained energy by irradiating molecules with radio waves returns to an original thermal equilibrium state is measured, and generally, it has been known that the relaxation time becomes shorter as the molecular movement is slower. Here, in the slurry containing the abrasive grains, water molecules (bound water) interacting with molecules on the surface of the abrasive grains are present on the surface of the abrasive grains. Further, since water molecules have large polarity, a hydrogen bond or the like is formed with the first particles or the second particles of the composite particles so that thermal stabilization is achieved. In this case, the molecular movement of bound water present on the surface of the abrasive grains is restricted, and thus the relaxation time of bound water becomes shorter than the relaxation time of water molecules (free water) in a free state of not being in contact with the abrasive grains. Here, the relaxation time Tav obtained by the pulsed NMR measurement represents an average value of the relaxation time reflecting the volume of bound water present on the surface of the abrasive grains and the relaxation time reflecting the volume of free water. Therefore, Tav becomes shorter as the volume of bound water is larger than the volume of free water (that is, the interaction between the molecules on the surface of the abrasive grains and water molecules is strong (affinity is high)), and as a result, the Rsp value obtained by the above Formula (1) is increased. That is, as the Rsp value is larger, it can be said that the abrasive grains are abrasive grains having high hydrophilicity.

When the slurry is filtered by using a filter, the coarse particles are captured by fine holes (pores) present in the filtering material of the filter so as to be removed. On the other hand, the liquid medium infiltrates to the holes of the filtering material by capillary action. The capillary action refers to a phenomenon that a liquid infiltrates to a narrow space surrounded by solid, and as the wettability of the solid with respect to the liquid (the level of the affinity of the solid with respect to the liquid) is higher, the liquid is easy to infiltrate to the space. In general, the sizes of the holes in the filtering material are not uniform, and the slurry is difficult to enter into fine holes. In particular, in a case where the surface of the filtering material is hydrophobic, the wettability of the filtering material with respect to water is small, and thus the slurry is difficult to infiltrate to the holes. In this case, since the slurry passes through holes having a relatively large pore size among the holes in the filtering material, the coarse particles are easy to pass through the holes, and thus the removal rate of the coarse particles is decreased.

In speculation of the present inventor, when abrasive grains adhere to the filtering material surface in a case where a slurry containing abrasive grains having high hydrophilicity (that is, a slurry having a large Rsp value) is caused to pass through a filter, the abrasive grains themselves are hydrophilic so that the filtering material surface is hydrophilized, and thus the wettability of the filtering material with respect to water is improved. As a result, the slurry is easy to infiltrate to holes and the coarse particles are easy to be captured, and thus the removal rate of the coarse particles is improved. From the above reasons, when the Rsp value is the above-described predetermined value or more, the removal rate of the coarse particles can be improved.

Meanwhile, by adjusting the method for producing particles, it is considered to avoid generation of coarse particles and mixing of coarse particles into a slurry and a polishing liquid. For example, a method of liquid-phase synthesizing microparticles is easier to reduce mixing of coarse particles than a method of pulverizing and micronizing particles of polycrystals (for example, polycrystal of cerium oxide). However, in such a method, in order to prevent unintentional generation of coarse particles, it is necessary to micronize particles by optimizing production conditions of particles. In this case, when the crystallite diameter of particles is small, mechanical polishing action is difficult to be obtained so that the polishing rate tends to be decreased, and thus it is difficult to achieve a high polishing rate for an insulating material while effectively reducing coarse particles.

On the other hand, according to the present embodiment, it is possible to achieve a high polishing rate for an insulating material (for example, silicon oxide) while effectively reducing coarse particles. The reasons why the polishing rate for an insulating material is improved in this way are, for example, the reasons to be as follows. However, the reasons are not limited to the reasons to be as follows.

That is, the first particles containing cerium oxide and having a larger particle size than that of the second particles have strong mechanical action (mechanical property) with respect to an insulating material as compared to the second particles. On the other hand, the second particles containing a cerium compound and having a smaller particle size than that of the first particles have small mechanical action with respect to an insulating material as compared to the first particles, but have strong chemical action (chemical property) with respect to an insulating material since the specific surface area (surface area per unit mass) in the whole particle is large. Therefore, a synergetic effect of improving the polishing rate is easily obtained by using the first particles having strong mechanical action and the second particles having strong chemical action. Thereby, a high polishing rate for an insulating material can be achieved.

According to the present embodiment, since a high polishing rate for an insulating material can be achieved, by adjusting the content of the abrasive grains to be decreased, it is also possible to reduce coarse particles. Furthermore, generally, as the content of abrasive grains is increased, polishing scratches tend to be easily generated. On the other hand, according to the present embodiment, since a sufficient polishing rate can be obtained even in a case where the content of the abrasive grains is small, by using a small amount of abrasive grains, an insulating material can be polished with fewer polishing scratches while a sufficient polishing rate is achieved.

As described above, in the slurry of the present embodiment, the Rsp value calculated by Formula (1) using the relaxation times Tav and Tb obtained by pulsed NMR measurement (pulsed nuclear magnetic resonance measurement) is 1.60 or more. The pulsed NMR measurement is a method of measuring a transverse relaxation time of hydrogen nucleus ($^1$H nucleus) and can be performed by using a pulsed NMR Particle Interface Characteristic Evaluation Apparatus (trade name: Acron Area) manufactured by Nihon Rufuto Co., Ltd. The relaxation time can be obtained by Carr Purcell Meiboom Gill method (CPMG method). The measurement temperature is 25° C. The Rsp value is an index of affinity between particles and water molecules and can be calculated by the above Formula (1) using the relaxation time Tav of the slurry and the relaxation time Tb of the supernatant solution obtained when the slurry is subjected to centrifugal separation.

The Rsp value is 1.60 or more from the viewpoint of obtaining an excellent removal rate of coarse particles. The lower limit of the Rsp value is preferably 1.80 or more, more preferably 2.00 or more, further preferably 2.20 or more, and particularly preferably 2.40 or more, from the viewpoint of easily obtaining an excellent removal rate of coarse particles. The upper limit of the Rsp value may be, for example, 10.0 or less.

Since the Rsp value is increased as the volume of bound water on the surface of the abrasive grains is increased, the Rsp value is likely to increase as the surface area of the abrasive grains to which bound water can be adsorbed is increased. Therefore, for example, the Rsp value can be adjusted by changing the particle size (average primary particle size or average secondary particle size) of the first particles and/or the second particles in the composite particles. Alternatively, the Rsp value can also be increased by hydrophilizing the surface of the abrasive grains. Examples of the hydrophilizing method include a method of covering the surface of abrasive grains with a compound having a functional group (for example, a carboxyl group) having high affinity with respect to water and a method of surface-modifying the abrasive grains by this compound.

The polishing liquid (CMP polishing liquid) of the present embodiment can be obtained, for example, by filtering the slurry of the present embodiment. The method for producing a polishing liquid of the present embodiment includes a filtering step of filtering the slurry of the present embodiment.

In the filtering step, the coarse particles can be removed by using a filter (filtering material). The shape of the filter is not particularly limited, and examples thereof include a disk type and a cartridge type. A cartridge type filter may be processed into the form of pleat from the viewpoint of enhancing liquid permeability.

Examples of materials constituting a filter include polypropylene, nylon, glass, polyester, polyether sulfone, polytetrafluoroethylene, polycarbonate, polyvinylidene fluoride, and a cellulose derivative. These materials may be processed into the form of a membrane or a fiber.

The pore size (nominal pore size) of the filter is preferably in the following range. The lower limit of the pore size of the filter is preferably 0.10 µm or more and more preferably 0.20 µm or more, from the viewpoint that a filtration rate is excellent, the viewpoint that the particle size distribution is hardly changed, and the viewpoint that the filter life (clogging prevention effect) is excellent. The upper limit of the pore size of the filter is preferably 3.0 µm or less, more preferably 2.0 µm or less, further preferably 1.0 µm or less, particularly preferably 0.80 µm or less, and extremely preferably 0.50 µm or less, from the viewpoint of easily obtaining an excellent removal rate of coarse particles. From the above-described viewpoints, the pore size of the filter is preferably 0.10 to 3.0 µm.

The filtration may be carried out in a single stage, and a multi-stage treatment in which a plurality of filters are combined may be performed. Furthermore, the slurry may be caused to pass through a single filter once, and a circulation treatment may be performed with respect to the same filter in plural times.

(Abrasive Grains)

As described above, the abrasive grains in the present embodiment include composite particles including first particles and second particles in contact with the first particles.

The particle size of the second particles is preferably smaller than the particle size of the first particles. The magnitude relationship in particle size between the first particles and the second particles can be determined from SEM images of the composite particles, or the like. In general, particles having a small particle size have a larger surface area per unit mass than that of particles having a large particle size, and thus have higher reaction activity. On the other hand, the mechanical action (mechanical polishing force) of particles having a small particle size is smaller than that of particles having a large particle size. However, in the present embodiment, even in a case where the particle size of the second particles is smaller than the particle size of the first particles, the synergetic effect of the first particles and the second particles can be expressed and both of excellent reaction activity and excellent mechanical action can be easily achieved.

The lower limit of the particle size of the first particles is preferably 15 nm or more, more preferably 25 nm or more, further preferably 35 nm or more, particularly preferably 40 nm or more, extremely preferably 50 nm or more, highly preferably 80 nm or more, and even more preferably 100 nm or more, from the viewpoint that the polishing rate for an insulating material is further improved. The upper limit of the particle size of the first particles is preferably 1000 nm or less, more preferably 800 nm or less, further preferably 600 nm or less, particularly preferably 400 nm or less, extremely preferably 300 nm or less, highly preferably 200 nm or less, and even more preferably 150 nm or less, from the viewpoint of improving the dispersibility of the abrasive grains and the viewpoint of easily suppressing scratches at a polished surface. From the above-described viewpoints, the particle size of the first particles is more preferably 15 to 1000 nm. The average particle size (average secondary particle size) of the first particles may be in the above ranges.

The lower limit of the particle size of the second particles is preferably 1 nm or more, more preferably 2 nm or more, and further preferably 3 nm or more, from the viewpoint that the polishing rate for an insulating material is further improved. The upper limit of the particle size of the second particles is preferably 50 nm or less, more preferably 30 nm or less, further preferably 25 nm or less, particularly preferably 20 nm or less, extremely preferably 15 nm or less, and highly preferably 10 nm or less, from the viewpoint of improving the dispersibility of the abrasive grains and the viewpoint of easily suppressing scratches at a polished surface. From the above-described viewpoints, the particle size of the second particles is more preferably 1 to 50 nm. The average particle size (average secondary particle size) of the second particles may be in the above ranges.

The average particle size (average secondary particle size) of the abrasive grains (the entire abrasive grains including composite particles) in the slurry or the polishing liquid is preferably in the following range. The lower limit of the average particle size of the abrasive grains is preferably 16 nm or more, more preferably 20 nm or more, further preferably 30 nm or more, particularly preferably 40 nm or more, extremely preferably 50 nm or more, highly preferably 100 nm or more, even more preferably 120 nm or more, further preferably 140 nm or more, particularly preferably 150 nm or more, and extremely preferably 155 nm or more, from the viewpoint that the polishing rate for an insulating material is further improved. The upper limit of the average particle size of the abrasive grains is preferably 1050 nm or less, more preferably 1000 nm or less, further preferably 800 nm or less, particularly preferably 600 nm or less, extremely preferably 500 nm or less, highly preferably 400 nm or less, even more preferably 300 nm or less, further preferably 200 nm or less, and particularly preferably 160 nm or less, from the viewpoint that the particle size distribution hardly changes, the viewpoint of improving the dispersibility of the abrasive grains, and the viewpoint of easily suppressing scratches at a polished surface. From the above-described viewpoints, the average particle size of the abrasive grains is more preferably 16 to 1050 nm.

The average particle size can be measured, for example, using a light diffraction scattering type particle size distribution meter (for example, trade name: N5 manufactured by Beckman Coulter, Inc. or trade name: MICROTRAC MT3300EXII manufactured by MicrotracBEL Corp.).

The first particles can have a negative zeta potential. The second particles can have a positive zeta potential. The zeta potential represents the surface potential of a particle. The zeta potential can be measured, for example, using a dynamic light scattering type zeta potential measuring apparatus (for example, trade name: DelsaNano C manufactured by Beckman Coulter, Inc.). The zeta potential of the particles can be adjusted using an additive. For example, by bringing ammonium dihydrogen phosphate, a material having carboxyl group (for example, polyacrylic acid) or the like into contact with particles containing cerium oxide, particles having a negative zeta potential can be obtained.

The first particles contain cerium oxide (for example, ceria) and the second particles contain a cerium compound. Examples of the cerium compound of the second particles include cerium hydroxide and cerium oxide. As the cerium compound of the second particles, a compound different from cerium oxide can be used. The cerium compound preferably contains cerium hydroxide. The abrasive grains containing cerium hydroxide have higher reactivity (chemical action) with an insulating material (for example, silicon oxide) by the action of the hydroxyl group than particles composed of silica, cerium oxide, or the like, and an insulating material can be polished at a higher polishing rate. The cerium hydroxide is, for example, a compound containing tetravalent cerium ($Ce^{4+}$) and at least one hydroxide ion ($OH^-$). The cerium hydroxide may contain an anion (for example, nitrate ion $NO_3^-$ and sulfate ion $SO_4^{2-}$) other than a hydroxide ion. For example, the cerium hydroxide may also contain an anion (for example, nitrate ion $NO_3^-$ and sulfate ion $SO_4^{2-}$) bonded to tetravalent cerium.

The cerium hydroxide can be prepared by reacting a cerium salt with an alkali source (base). The cerium hydroxide is preferably prepared by mixing a cerium salt with an alkali liquid (for example, alkali aqueous solution). Thereby, it is possible to obtain particles having an extremely fine particle size, and easily obtain an excellent effect of reducing polishing scratches. Such a technique is disclosed in, for example, Patent Literatures 3 and 4. The cerium hydroxide can be obtained by mixing a cerium salt solution (for example, a cerium salt aqueous solution) with alkali liquid. Examples of the cerium salt include $Ce(NO_3)_4$, $Ce(SO_4)_2$, $Ce(NH_4)_2(NO_3)_6$, and $Ce(NH_4)_4(SO_4)_4$.

It is considered that particles including $Ce(OH)_aX_b$ (in the formula, a+b×c=4) composed of tetravalent cerium ($Ce^{4+}$), one to three hydroxide ions ($OH^-$), and one to three anions ($X^{c-}$) are generated (incidentally, such particles are also "cerium hydroxide") depending on production conditions of cerium hydroxide and the like. It is considered that, in $Ce(OH)_aX_b$, an electron-withdrawing anion ($X^{c-}$) acts to enhance reactivity of the hydroxide ion and the polishing rate is improved with the increase in abundance of $Ce(OH)_aX_b$. Examples of the anions ($X^{c-}$) include $NO_3^-$ and $SO_4^{2-}$. It is considered that the particles containing cerium hydroxide can contain not only $Ce(OH)_aX_b$ but also $Ce(OH)_4$, $CeO_2$, or the like.

The containing of $Ce(OH)_aX_b$ in the particles containing cerium hydroxide can be confirmed by a method for detecting a peak corresponding to the anions ($X^{c-}$) with FT-IR ATR method (Fourier transform Infra Red Spectrometer Attenuated Total Reflection method) after washing the particles with pure water well. The existence of the anions ($X^{c-}$) can also be confirmed by XPS method (X-ray Photoelectron Spectroscopy).

The composite particles including the first particles and the second particles can be obtained by bringing the first particles and the second particles into contact with each other using a homogenizer, a nanomizer, a ball mill, a bead mill, a sonicator, or the like; by bringing the first particles and the second particles each having opposing charges to each other into contact with each other; by bringing the first particles and the second particles into contact with each other in a state of a small content of the particles; or the like.

According to the present embodiment, it is possible to provide a method for producing abrasive grains, the method including a step of bringing first particles containing cerium oxide into contact with second particles containing a cerium compound. According to the present embodiment, it is possible to provide a method for producing a slurry, the method including a step of obtaining abrasive grains by the aforementioned method for producing abrasive grains.

The lower limit of the content of cerium oxide in the first particles is preferably 50% by mass or more, more preferably 70% by mass or more, further preferably 90% by mass or more, and particularly preferably 95% by mass or more, on the basis of the entire first particles (the entire first particles contained in the slurry or the polishing liquid; the same applies hereinafter), from the viewpoint that the polishing rate for an insulating material is further improved. The first particles may be an embodiment substantially composed of cerium oxide (an embodiment in which substantially 100% by mass of the first particles are cerium oxide).

The lower limit of the content of the cerium compound in the second particles is preferably 50% by mass or more, more preferably 70% by mass or more, further preferably 90% by mass or more, and particularly preferably 95% by mass or more, on the basis of the entire second particles (the entire second particles contained in the slurry or the polishing liquid; the same applies hereinafter), from the viewpoint that the polishing rate for an insulating material is further improved. The second particles may be an embodiment substantially composed of a cerium compound (an embodiment in which substantially 100% by mass of the second particles are a cerium compound).

The content of the second particles can be estimated on the basis of a value of absorbance of equation below which is obtained by a spectrophotometer when light having a specific wavelength is transmitted through the slurry or the polishing liquid. That is, in a case where particles absorb light having a specific wavelength, the light transmittance of a region containing these particles is decreased. The light transmittance is decreased not only by absorption of the particles but also by scattering, but in the second particles, the influence of scattering is small Therefore, in the present embodiment, the content of the second particles can be estimated on the basis of a value of absorbance calculated by equation below.

Absorbance=$-\mathrm{LOG}_{10}$(Light transmittance [%]/100)

The content of the first particles in the abrasive grains is preferably in the following range on the basis of the entire abrasive grains (the entire abrasive grains contained in the slurry or the polishing liquid). The lower limit of the content of the first particles is preferably 50% by mass or more, more preferably more than 50% by mass, further preferably 60% by mass or more, particularly preferably 70% by mass or more, extremely preferably 75% by mass or more, highly preferably 80% by mass or more, and even more preferably 85% by mass or more, from the viewpoint that the polishing rate for an insulating material is further improved. The upper limit of the content of the first particles is preferably 97% by mass or less, more preferably 95% by mass or less, further preferably 93% by mass or less, particularly preferably 90% by mass or less, extremely preferably 88% by mass or less, and highly preferably 86% by mass or less, from the viewpoint that the polishing rate for an insulating material is further improved. From the above-described viewpoints, the content of the first particles is more preferably 50 to 97% by mass.

The content of the second particles in the abrasive grains is preferably in the following range on the basis of the entire abrasive grains (the entire abrasive grains contained in the slurry or the polishing liquid). The lower limit of the content of the second particles is preferably 3% by mass or more, more preferably 5% by mass or more, further preferably 7% by mass or more, particularly preferably 10% by mass or more, extremely preferably 12% by mass or more, and highly preferably 14% by mass or more, from the viewpoint that the polishing rate for an insulating material is further improved. The upper limit of the content of the second particles is preferably 50% by mass or less, more preferably less than 50% by mass, further preferably 40% by mass or less, particularly preferably 30% by mass or less, extremely preferably 25% by mass or less, highly preferably 20% by mass or less, and even more preferably 15% by mass or less, from the viewpoint that the polishing rate for an insulating material is further improved. From the above-described viewpoints, the content of the second particles is more preferably 3 to 50% by mass.

The content of cerium oxide in the abrasive grains is preferably in the following range on the basis of the entire abrasive grains (the entire abrasive grains contained in the slurry or the polishing liquid). The lower limit of the content of cerium oxide is preferably 50% by mass or more, more preferably more than 50% by mass, further preferably 60% by mass or more, particularly preferably 70% by mass or more, extremely preferably 75% by mass or more, highly preferably 80% by mass or more, and even more preferably 85% by mass or more, from the viewpoint that the polishing rate for an insulating material is further improved. The upper limit of the content of cerium oxide is preferably 97% by mass or less, more preferably 95% by mass or less, further preferably 93% by mass or less, particularly preferably 90% by mass or less, extremely preferably 88% by mass or less, and highly preferably 86% by mass or less, from the viewpoint that the polishing rate for an insulating material is further improved. From the above-described viewpoints, the content of cerium oxide is more preferably 50 to 97% by mass.

The content of cerium hydroxide in the abrasive grains is preferably in the following range on the basis of the entire abrasive grains (the entire abrasive grains contained in the slurry or the polishing liquid). The lower limit of the content of cerium hydroxide in the abrasive grains is preferably 3% by mass or more, more preferably 5% by mass or more, further preferably 7% by mass or more, particularly preferably 10% by mass or more, extremely preferably 12% by mass or more, and highly preferably 14% by mass or more, from the viewpoint that the polishing rate for an insulating material is further improved. The upper limit of the content of cerium hydroxide in the abrasive grains is preferably 50% by mass or less, more preferably less than 50% by mass, further preferably 40% by mass or less, particularly preferably 30% by mass or less, extremely preferably 25% by mass or less, highly preferably 20% by mass or less, and even more preferably 15% by mass or less, from the viewpoint that the polishing rate for an insulating material is further improved. From the above-described viewpoints, the content of cerium hydroxide in the abrasive grains is more preferably 3 to 50% by mass.

The content of the first particles in the slurry or the polishing liquid is preferably in the following range on the basis of the total amount of the first particles and the second particles. The lower limit of the content of the first particles is preferably 50% by mass or more, more preferably more than 50% by mass, further preferably 60% by mass or more, particularly preferably 70% by mass or more, extremely preferably 75% by mass or more, highly preferably 80% by mass or more, and even more preferably 85% by mass or more, from the viewpoint that the polishing rate for an insulating material is further improved. The upper limit of the content of the first particles is preferably 97% by mass or less, more preferably 95% by mass or less, further preferably 93% by mass or less, particularly preferably 90% by mass or less, extremely preferably 88% by mass or less, and highly preferably 86% by mass or less, from the viewpoint that the polishing rate for an insulating material is further improved. From the above-described viewpoints, the content of the first particles is more preferably 50 to 97% by mass.

The content of the second particles in the slurry or the polishing liquid is preferably in the following range on the basis of the total amount of the first particles and the second particles. The lower limit of the content of the second particles is preferably 3% by mass or more, more preferably 5% by mass or more, further preferably 7% by mass or more, particularly preferably 10% by mass or more, extremely preferably 12% by mass or more, and highly preferably 14% by mass or more, from the viewpoint that the polishing rate for an insulating material is further improved. The upper limit of the content of the second particles is preferably 50% by mass or less, more preferably less than 50% by mass, further preferably 40% by mass or less, particularly preferably 30% by mass or less, extremely preferably 25% by mass or less, highly preferably 20% by mass or less, and even more preferably 15% by mass or less, from the viewpoint that the polishing rate for an insulating material is further improved. From the above-described viewpoints, the content of the second particles is more preferably 3 to 50% by mass.

The content of the first particles in the slurry is preferably in the following range on the basis of the total mass of the slurry. The lower limit of the content of the first particles is preferably 0.05% by mass or more, more preferably 0.08% by mass or more, further preferably 0.1% by mass or more, particularly preferably 0.5% by mass or more, extremely preferably 0.8% by mass or more, and highly preferably 1% by mass or more, from the viewpoint that the polishing rate for an insulating material is further improved. The upper limit of the content of the first particles is preferably 10% by mass or less, more preferably 8% by mass or less, further preferably 5% by mass or less, particularly preferably 4% by mass or less, extremely preferably 3% by mass or less, and highly preferably 2% by mass or less, from the viewpoint of enhancing the storage stability of the slurry. From the above-described viewpoints, the content of the first particles is more preferably 0.05 to 10% by mass.

The content of the first particles in the polishing liquid is preferably in the following range on the basis of the total mass of the polishing liquid. The lower limit of the content of the first particles is preferably 0.005% by mass or more, more preferably 0.008% by mass or more, further preferably 0.01% by mass or more, particularly preferably 0.05% by mass or more, extremely preferably 0.07% by mass or more, and highly preferably 0.08% by mass or more, from the viewpoint that the polishing rate for an insulating material is further improved. The upper limit of the content of the first particles is preferably 10% by mass or less, more preferably 5% by mass or less, further preferably 1% by mass or less, particularly preferably 0.5% by mass or less, extremely preferably 0.3% by mass or less, highly preferably 0.2% by mass or less, and even more preferably 0.1% by mass or less, from the viewpoint of enhancing the storage stability of the polishing liquid and the viewpoint of easily suppressing scratches at a polished surface. From the above-described viewpoints, the content of the first particles is more preferably 0.005 to 1% by mass.

The content of the second particles in the slurry is preferably in the following range on the basis of the total mass of the slurry. The lower limit of the content of the second particles is preferably 0.05% by mass or more, more preferably 0.1% by mass or more, further preferably 0.15% by mass or more, particularly preferably 0.2% by mass or more, extremely preferably 0.25% by mass or more, highly preferably 0.275% by mass or more, even more preferably 0.3% by mass or more, further preferably 0.325% by mass or more, and particularly preferably 0.35% by mass or more, from the viewpoint of further enhancing a chemical interaction between the abrasive grains and a surface to be polished so that the polishing rate for an insulating material is further improved. The upper limit of the content of the second particles is preferably 5% by mass or less, more preferably 3% by mass or less, further preferably 1% by mass or less, particularly preferably 0.5% by mass or less, and extremely preferably 0.4% by mass or less, from the viewpoints of easily avoiding the aggregation of the abrasive grains, and easily obtaining a more favorable chemical interaction between the abrasive grains and a surface to be polished to easily utilize the properties of the abrasive grains effectively. From the above-described viewpoints, the content of the second particles is more preferably 0.05 to 5% by mass.

The content of the second particles in the polishing liquid is preferably in the following range on the basis of the total mass of the polishing liquid. The lower limit of the content of the second particles is preferably 0.001% by mass or more, more preferably 0.003% by mass or more, further preferably 0.005% by mass or more, particularly preferably 0.008% by mass or more, extremely preferably 0.01% by mass or more, highly preferably 0.012% by mass or more, and even more preferably 0.014% by mass or more, from the viewpoint of further enhancing a chemical interaction between the abrasive grains and a surface to be polished so that the polishing rate for an insulating material is further improved. The upper limit of the content of the second particles is preferably 1% by mass or less, more preferably 0.5% by mass or less, further preferably 0.1% by mass or less, particularly preferably 0.05% by mass or less, extremely preferably 0.03% by mass or less, highly preferably 0.02% by mass or less, and even more preferably 0.015% by mass or less, from the viewpoints of easily avoiding the aggregation of the abrasive grains, and easily obtaining a more favorable chemical interaction between the abrasive grains and a surface to be polished to easily utilize the properties of the abrasive grains effectively. From the above-described viewpoints, the content of the second particles is more preferably 0.001 to 1% by mass.

The content of cerium oxide in the slurry is preferably in the following range on the basis of the total mass of the slurry. The lower limit of the content of cerium oxide is preferably 0.05% by mass or more, more preferably 0.08% by mass or more, further preferably 0.1% by mass or more, particularly preferably 0.5% by mass or more, extremely preferably 0.8% by mass or more, and highly preferably 1% by mass or more, from the viewpoint that the polishing rate for an insulating material is further improved. The upper limit of the content of cerium oxide is preferably 10% by mass or less, more preferably 8% by mass or less, further preferably 5% by mass or less, particularly preferably 4% by mass or less, extremely preferably 3% by mass or less, and highly preferably 2% by mass or less, from the viewpoint of enhancing the storage stability of the slurry. From the above-described viewpoints, the content of cerium oxide is more preferably 0.05 to 10% by mass.

The content of cerium oxide in the polishing liquid is preferably in the following range on the basis of the total mass of the polishing liquid. The lower limit of the content of cerium oxide is preferably 0.005% by mass or more, more preferably 0.008% by mass or more, further preferably 0.01% by mass or more, particularly preferably 0.05% by mass or more, extremely preferably 0.07% by mass or more, and highly preferably 0.08% by mass or more, from the viewpoint that the polishing rate for an insulating material is further improved. The upper limit of the content of cerium oxide is preferably 10% by mass or less, more preferably 5% by mass or less, further preferably 1% by mass or less, particularly preferably 0.5% by mass or less, extremely preferably 0.3% by mass or less, highly preferably 0.2% by mass or less, and even more preferably 0.1% by mass or less, from the viewpoint of enhancing the storage stability of the polishing liquid and the viewpoint of easily suppressing scratches at a polished surface. From the above-described viewpoints, the content of cerium oxide is more preferably 0.005 to 1% by mass.

The content of cerium hydroxide in the slurry is preferably in the following range on the basis of the total mass of the slurry. The lower limit of the content of cerium hydroxide is preferably 0.05% by mass or more, more preferably 0.1% by mass or more, further preferably 0.15% by mass or more, particularly preferably 0.2% by mass or more, extremely preferably 0.25% by mass or more, highly preferably 0.275% by mass or more, even more preferably 0.3% by mass or more, further preferably 0.325% by mass or more, and particularly preferably 0.35% by mass or more, from the viewpoint of further enhancing a chemical interaction between the abrasive grains and a surface to be polished so that the polishing rate for an insulating material is further improved. The upper limit of the content of cerium hydroxide is preferably 5% by mass or less, more preferably 3% by mass or less, further preferably 1% by mass or less, particularly preferably 0.5% by mass or less, and extremely preferably 0.4% by mass or less, from the viewpoints of easily avoiding the aggregation of the abrasive grains, and easily obtaining a more favorable chemical interaction between the abrasive grains and a surface to be polished to easily utilize the properties of the abrasive grains effectively. From the above-described viewpoints, the content of cerium hydroxide is more preferably 0.05 to 5% by mass.

The content of cerium hydroxide in the polishing liquid is preferably in the following range on the basis of the total mass of the polishing liquid. The lower limit of the content of cerium hydroxide is preferably 0.001% by mass or more, more preferably 0.003% by mass or more, further preferably 0.005% by mass or more, particularly preferably 0.008% by mass or more, extremely preferably 0.01% by mass or more, highly preferably 0.012% by mass or more, and even more preferably 0.014% by mass or more, from the viewpoint of further enhancing a chemical interaction between the abrasive grains and a surface to be polished so that the polishing rate for an insulating material is further improved. The upper limit of the content of cerium hydroxide is preferably 1% by mass or less, more preferably 0.5% by mass or less, further preferably 0.1% by mass or less, particularly preferably 0.05% by mass or less, extremely preferably 0.03% by mass or less, highly preferably 0.02% by mass or less, and even more preferably 0.015% by mass or less, from the viewpoints of easily avoiding the aggregation of the abrasive grains, and easily obtaining a more favorable chemical interaction between the abrasive grains and a surface to be polished to easily utilize the properties of the abrasive grains effectively. From the above-described viewpoints, the content of cerium hydroxide is more preferably 0.001 to 1% by mass.

The content of the abrasive grains in the slurry is preferably in the following range on the basis of the total mass of the slurry. The lower limit of the content of the abrasive grains is preferably 0.01% by mass or more, more preferably 0.05% by mass or more, further preferably 0.1% by mass or more, particularly preferably 0.5% by mass or more, extremely preferably 1% by mass or more, highly preferably 1.5% by mass or more, even more preferably 2% by mass or more, further preferably 2.1% by mass or more, particularly preferably 2.2% by mass or more, extremely preferably 2.3% by mass or more, and highly preferably 2.35% by mass or more, from the viewpoint that the polishing rate for an insulating material is further improved. The upper limit of the content of the abrasive grains is preferably 10% by mass or less, more preferably 8% by mass or less, further preferably 5% by mass or less, particularly preferably 4% by mass or less, and extremely preferably 3% by mass or less, from the viewpoint of enhancing the storage stability of the slurry. From the above-described viewpoints, the content of the abrasive grains is more preferably 0.01 to 10% by mass.

The content of the abrasive grains in the polishing liquid is preferably in the following range on the basis of the total mass of the polishing liquid. The lower limit of the content of the abrasive grains is preferably 0.01% by mass or more, more preferably 0.02% by mass or more, further preferably 0.03% by mass or more, particularly preferably 0.05% by mass or more, extremely preferably 0.08% by mass or more, and highly preferably 0.1% by mass or more, from the viewpoint that the polishing rate for an insulating material is further improved. The upper limit of the content of the abrasive grains is preferably 10% by mass or less, more preferably 5% by mass or less, further preferably 3% by mass or less, particularly preferably 1% by mass or less, extremely preferably 0.5% by mass or less, highly preferably 0.3% by mass or less, and even more preferably 0.2% by mass or less, from the viewpoint of enhancing the storage stability of the polishing liquid and the viewpoint of easily suppressing scratches at a polished surface. From the above-described viewpoints, the content of the abrasive grains is more preferably 0.01 to 10% by mass.

The slurry or the polishing liquid of the present embodiment may contain particles other than the composite particles including the first particles and the second particles. Examples of such other particles include the first particles not in contact with the second particles; the second particles not in contact with the first particles; and third particles composed of silica, alumina, zirconia, yttria, or the like (particles not including the first particles and the second particles).

(Liquid Medium)

The liquid medium is not particularly limited; however, water such as deionized water or ultrapure water is preferred. The content of the liquid medium may be the balance of the slurry or the polishing liquid remaining after excluding the contents of other constituent components, and the content is not particularly limited.

(Optional Components)

The slurry or the polishing liquid of the present embodiment may further contain optional additives. Examples of the optional additives include a material having a carboxyl group (excluding a compound corresponding to a polyoxyalkylene compound or a water-soluble polymer), a polyoxyalkylene compound, a water-soluble polymer, an oxidizing agent (for example, hydrogen peroxide), and a dispersant (for example, a phosphoric acid-based inorganic salt). The respective additives can be used singly or in combination of two or more kinds thereof.

Examples of the material having a carboxyl group include monocarboxylic acids such as acetic acid, propionic acid, butyric acid, and valeric acid; hydroxy acids such as lactic acid, malic acid, and citric acid; dicarboxylic acids such as malonic acid, succinic acid, fumaric acid, and maleic acid; polycarboxylic acids such as polyacrylic acid and polymaleic acid; and amino acids such as arginine, histidine, and lysine.

Examples of the polyoxyalkylene compound include a polyalkylene glycol and a polyoxyalkylene derivative.

Examples of the polyalkylene glycol include polyethylene glycol, polypropylene glycol, and polybutylene glycol. The polyalkylene glycol is preferably at least one selected from the group consisting of polyethylene glycol and polypropylene glycol, and is more preferably polyethylene glycol.

A polyoxyalkylene derivative is, for example, a compound obtained by introducing a functional group or a substituent to a polyalkylene glycol, or a compound obtained by adding a polyalkylene oxide to an organic compound. Examples of the functional group or a substituent include an alkyl ether group, an alkyl phenyl ether group, a phenyl ether group, a styrenated phenyl ether group, a glyceryl ether group, an alkylamine group, a fatty acid ester group, and a glycol ester group. Examples of the polyoxyalkylene derivative include a polyoxyethylene alkyl ether, polyoxyethylene bisphenol ether (for example, manufactured by NIPPON NYUKAZAI CO., LTD., BA GLYCOL series), polyoxyethylene styrenated phenyl ether (for example, manufactured by Kao Corporation, EMULGEN series), a polyoxyethylene alkyl phenyl ether (for example, manufactured by DKS Co. Ltd., NOIGEN EA series), a polyoxyalkylene polyglyceryl ether (for example, manufactured by Sakamoto Yakuhin Kogyo Co., Ltd., SC-E series and SC-P series), a polyoxyethylene sorbitan fatty acid ester (for example, manufactured by DKS Co. Ltd., SORGEN TW series), a polyoxyethylene fatty acid ester (for example, manufactured by Kao Corporation, EMANON series), a polyoxyethylene alkylamine (for example, manufactured by DKS Co. Ltd., AMIRADIN D), and other compounds having a polyalkylene oxide added thereto (for example, manufactured by Nissin Chemical Co., Ltd., SURFINOL 465, and manufactured by NIPPON NYUKAZAI CO., LTD., TMP series).

The "water-soluble polymer" is defined as a polymer which is dissolved in 100 g of water in an amount of 0.1 g or more. A polymer that corresponds to the polyoxyalkylene compound is not to be included in the "water-soluble polymer". The water-soluble polymer is not particularly limited, and examples include acrylic polymers such as polyacrylamide and polydimethylacrylamide; polysaccharides such as carboxymethyl cellulose, agar, curdlan, dextrin, cyclodextrin, and pullulan; vinyl-based polymers such as polyvinyl alcohol, polyvinylpyrrolidone, and polyacrolein; glycerin-based polymers such as polyglycerin and a polyglycerin derivative; and polyethylene glycol.

(Characteristics of Slurry or Polishing Liquid)

The lower limit of the pH of the slurry or the polishing liquid of the present embodiment is preferably 2.0 or more, more preferably 2.5 or more, further preferably 2.8 or more, particularly preferably 3.0 or more, extremely preferably 3.2 or more, highly preferably 3.5 or more, even more preferably 4.0 or more, further preferably 4.2 or more, and particularly preferably 4.3 or more, from the viewpoint that the polishing rate for an insulating material is further improved. The upper limit of the pH is preferably 7.0 or less, more preferably 6.5 or less, further preferably 6.0 or less, particularly preferably 5.0 or less, extremely preferably 4.8 or less, highly preferably 4.7 or less, even more preferably 4.6 or less, further preferably 4.5 or less, and particularly preferably 4.4 or less, from the viewpoint that the storage stability of the slurry or the polishing liquid is further improved. From the above-described viewpoints, the pH is more preferably 2.0 to 7.0. The pH is defined as the pH at a liquid temperature of 25° C.

The pH can be adjusted by means of an acid component such as an inorganic acid or an organic acid; an alkali component such as ammonia, sodium hydroxide, tetramethylammonium hydroxide (TMAH), imidazole, or an alkanolamine; or the like. A buffering agent may be added in order to stabilize the pH. A buffering agent may be added as a buffer solution (a liquid containing a buffering agent). Examples of such a buffer solution include an acetate buffer solution and a phthalate buffer solution.

The pH can be measured by a pH meter (for example, Model No. PHL-40 manufactured by DKK-TOA CORPORATION). Specifically, for example, a pH meter is subjected to two-point calibration using a phthalate pH buffer solution (pH: 4.01) and a neutral phosphate pH buffer solution (pH: 6.86) as standard buffer solutions, subsequently the electrode of the pH meter is introduced into the slurry or the polishing liquid, and the value after being stabilized after a lapse of two minutes or longer is measured. Both of the liquid temperatures are set to 25° C.

In a case where the slurry or the polishing liquid of the present embodiment is used as a CMP polishing liquid, the constituent components of the polishing liquid may be stored as a one-pack polishing liquid, or may be stored as a multi-pack (for example, two-pack) polishing liquid set in which the constituent components of the polishing liquid are divided into a first liquid and a second liquid such that the first liquid containing abrasive grains and a liquid medium, and the second liquid (additive liquid) containing additives and a liquid medium are mixed to form the polishing liquid. The second liquid may contain, for example, an oxidizing agent. The constituent components of the polishing liquid may be stored as a polishing liquid set divided into three or more liquids.

In the polishing liquid set, the first liquid and the second liquid are mixed immediately before polishing or during polishing to prepare the polishing liquid. Furthermore, a one-pack polishing liquid may be stored as a stock solution for a polishing liquid with a reduced liquid medium content and used by dilution with a liquid medium at the time of polishing. A multi-pack polishing liquid set may be stored as a stock solution for a first liquid and a stock solution for a second liquid with reduced liquid medium contents, and used by dilution with a liquid medium at the time of polishing.

Polishing Method

A first embodiment of the polishing method (such as a polishing method of a base substrate) of the present embodiment includes a step of polishing a surface to be polished by using a polishing liquid obtained by the above-described method for producing a polishing liquid. A second embodiment of the polishing method (such as a polishing method of a base substrate) of the present embodiment includes a polishing step of polishing a surface to be polished (such as a surface to be polished of a base substrate) by using the above-described slurry (the slurry before filtration) as a polishing liquid. According to the present embodiment, a high polishing rate for an insulating material can be achieved. The slurry of the present embodiment can be used as, for example, a polishing liquid (CMP polishing liquid). The polishing liquid in the polishing step may be a polishing liquid obtained by mixing the first liquid and the second liquid of the above-described polishing liquid set. The surface to be polished contains, for example, silicon oxide.

According to the present embodiment, it is possible to provide use of a slurry or a polishing liquid in polishing of a surface to be polished containing silicon oxide. According to the present embodiment, it is possible to provide use of a slurry or a polishing liquid in a flattening step of a base substrate surface that is the manufacturing technology of semiconductor elements. According to the present embodiment, it is possible to provide use of a slurry or a polishing liquid in a flattening step of STI insulating materials, pre-metal insulating materials, or interlayer insulating materials.

In the polishing step, for example, in a state where a material to be polished of the base substrate that has the material to be polished is pressed against a polishing pad (polishing cloth) of a polishing platen, the slurry or the polishing liquid is supplied between the material to be polished and the polishing pad, and the base substrate and the polishing platen are moved relative to each other to polish the surface to be polished of the material to be polished. In the polishing step, for example, at least a part of a material to be polished is removed by polishing.

As the base substrate that is to be polished, a substrate to be polished or the like is exemplified. As the substrate to be polished, for example, a base substrate in which a material to be polished is formed on a substrate for semiconductor element production (for example, a semiconductor substrate in which an STI pattern, a gate pattern, a wiring pattern, or the like is formed) is exemplified. Examples of the material to be polished include an insulating material such as silicon oxide. The material to be polished may be a single material or a plurality of materials. In a case where a plurality of materials are exposed on a surface to be polished, they can be considered as a material to be polished. The material to be polished may be in the form of a film (film to be polished) or may be an insulating film such as a silicon oxide film.

By polishing a material to be polished (for example, an insulating material such as silicon oxide) formed on such a substrate with the slurry or the polishing liquid and removing an excess part, it is possible to eliminate irregularities on the surface of a material to be polished and to produce a smooth surface over the entire surface of the polished material.

In the polishing method of the present embodiment, as a polishing apparatus, it is possible to use a common polishing apparatus which has a holder capable of holding a base substrate having a surface to be polished and a polishing platen to which a polishing pad can be pasted. A motor or the like in which the number of rotations can be changed is attached to each of the holder and the polishing platen. As the polishing apparatus, for example, polishing apparatus: F-REX300 manufactured by EBARA CORPORATION, or polishing apparatus: MIRRA manufactured by Applied Materials, Inc. can be used.

As the polishing pad, common unwoven cloth, a foamed body, an unfoamed body, and the like can be used. As the material for the polishing pad, it is possible to use a resin such as polyurethane, an acrylic resin, polyester, an acrylic-ester copolymer, polytetrafluoroethylene, polypropylene, polyethylene, poly-4-methylpentene, cellulose, cellulose ester, polyamide (for example, Nylon (trade name) and aramid), polyimide, polyimidamide, a polysiloxane copolymer, an oxirane compound, a phenolic resin, polystyrene, polycarbonate, or an epoxy resin. Particularly, from the viewpoint of obtaining further excellent polishing rate and flattening properties, the material for the polishing pad is preferably at least one selected from the group consisting of a foamed polyurethane and a non-foamed polyurethane. It is preferable that the polishing pad is subjected to groove processing, by which the slurry or the polishing liquid accumulates thereon.

Polishing conditions are not limited, but the upper limit of the rotation speed of a polishing platen is preferably 200 min$^{-1}$ (min$^{-1}$=rpm) or less such that the base substrate is not let out, and the upper limit of the polishing pressure to be applied to the base substrate (processing load) is preferably 100 kPa or less from the viewpoint of easily suppressing the generation of polishing scratches. The slurry or the polishing liquid is preferably continuously supplied to the polishing pad with a pump or the like during polishing. There are no limitations on the supply amount for this, however, it is preferable that the surface of the polishing pad is always covered with the slurry or the polishing liquid.

The present embodiment is preferably used for polishing a surface to be polished containing silicon oxide. The present embodiment can be suitably used in formation of an STI and polishing of an interlayer insulating material at a high rate. The lower limit of the polishing rate for an insulating material (for example, silicon oxide) is preferably 150 nm/min or more, more preferably 200 nm/min or more, further preferably 300 nm/min or more, and particularly preferably 400 nm/min or more.

The present embodiment can also be used in polishing of a pre-metal insulating material. Examples of the pre-metal insulating material include silicon oxide, phosphorus-silicate glass, boron-phosphorus-silicate glass, silicon oxyfluoride, and fluorinated amorphous carbon.

The present embodiment can also be applied to materials other than the insulating material such as silicon oxide. Examples of such a material include high permittivity materials such as Hf-based, Ti-based, and Ta-based oxides; semiconductor materials such as silicon, amorphous silicon, SiC, SiGe, Ge, GaN, GaP, GaAs, and organic semiconductors; phase-change materials such as GeSbTe; inorganic electroconductive materials such as ITO; and polymer resin materials such as polyimide-based, polybenzooxazole-based, acrylic, epoxy-based, and phenol-based materials.

The present embodiment can be applied not only to film-like objects to be polished, but also to various types of substrates made of glass, silicon, SiC, SiGe, Ge, GaN, GaP, GaAs, sapphire, plastics, or the like.

The present embodiment can be used not only for the production of semiconductor elements, but also for the production of image display devices such as TFT or organic EL; optical components such as a photomask, a lens, a prism, an optical fiber, or a single crystal scintillator; optical elements such as an optical switching element or an optical waveguide; light-emitting elements such as a solid laser or

EXAMPLES

Hereinafter, the present invention will be specifically described based on Examples; however, the present invention is not limited to the following Examples.

Preparation of Cerium Oxide Slurry A

Particles containing cerium oxide (first particles; hereinafter, referred to as "cerium oxide particles"; cerium oxide particles A) and trade name; ammonium dihydrogen phosphate manufactured by Wako Pure Chemical Industries, Ltd. (molecular weight: 97.99) were mixed to prepare a cerium oxide slurry A (pH: 7) containing 5.0% by mass (solid content amount) of the cerium oxide particles. The mixing amount of the ammonium dihydrogen phosphate was adjusted to 1% by mass on the basis of the total amount of the cerium oxide particles.

An adequate amount of the cerium oxide slurry A was introduced into trade name: MICROTRAC MT3300EXII manufactured by MicrotracBEL Corp., and the average particle size of the cerium oxide particles was measured. The displayed average particle size value was obtained as the average particle size (average secondary particle size). The average particle size of the cerium oxide particles in the cerium oxide slurry A was 145 nm.

An adequate amount of the cerium oxide slurry A was introduced into trade name: DelsaNano C manufactured by Beckman Coulter, Inc. and measurement was performed twice at 25° C. The average value of the displayed zeta potentials was obtained as the zeta potential. The zeta potential of the cerium oxide particles in the cerium oxide slurry A was −55 mV.

Preparation of Cerium Hydroxide Slurry (Synthesis of Cerium Hydroxide)

480 g of an aqueous 50% by mass $Ce(NH_4)_2(NO_3)_6$ solution (trade name: CANSO liquid manufactured by Nihon Kagaku Sangyo Co., Ltd.) was mixed with 7450 g of pure water to obtain a solution. Next, while this solution was stirred, 750 g of an aqueous solution of imidazole (10% by mass aqueous solution, 1.47 mol/L) was added dropwise thereto at a mixing rate of 5 mL/min, and thereby a precipitate containing cerium hydroxide was obtained. The cerium hydroxide was synthesized at a temperature of 20° C. and a stirring speed of 500 min' The stirring was performed using a 3-blade pitch paddle with a total blade section length of 5 cm.

The obtained precipitate (precipitate containing cerium hydroxide) was subjected to centrifugal separation (4000 min', for 5 minutes), and then subjected to solid-liquid separation with removal of a liquid phase by decantation. 10 g of the particles obtained by solid-liquid separation were mixed with 990 g of water, and then the particles were dispersed in water using an ultrasonic cleaner, thereby preparing a cerium hydroxide slurry (content of particles: 1.0% by mass) containing particles that contained cerium hydroxide (second particles; hereinafter, referred to as "cerium hydroxide particles").

(Measurement of Average Particle Size)

When the average particle size (average secondary particle size) of the cerium hydroxide particles in the cerium hydroxide slurry was measured using trade name: N5 manufactured by Beckman Coulter, Inc., a value of 10 nm was obtained. The measuring method was as follows. First, about 1 mL of a measuring sample (cerium hydroxide slurry, aqueous dispersion liquid) containing 1.0% by mass of cerium hydroxide particles was introduced into a 1-cm square cell, and then the cell was placed in the N5. Measurement was performed at 25° C. with the refractive index set to 1.333 and the viscosity set to 0.887 mPa·s as the measuring sample information of N5 software, and the value displayed as Unimodal Size Mean was read off.

(Measurement of Zeta Potential)

An adequate amount of the cerium hydroxide slurry was introduced into trade name: DelsaNano C manufactured by Beckman Coulter, Inc. and measurement was performed twice at 25° C. The average value of the displayed zeta potentials was obtained as the zeta potential. The zeta potential of the cerium hydroxide particles in the cerium hydroxide slurry was +50 mV.

(Structural Analysis of Cerium Hydroxide Particles)

An adequate amount of the cerium hydroxide slurry was taken and vacuum-dried to isolate the cerium hydroxide particles, and then sufficiently washed with pure water to obtain a sample. When the obtained sample was measured by FT-IR ATR method, a peak based on nitrate ion ($NO_3^-$) was observed in addition to a peak based on hydroxide ion ($OH^-$). Furthermore, when the same sample was measured by XPS (N-XPS) for nitrogen, a peak based on nitrate ion was observed while no peak based on $NH_4^+$ was observed. These results confirmed that the cerium hydroxide particles at least partially contained particles having nitrate ion bonded to a cerium element. Furthermore, since particles having hydroxide ion bonded to a cerium element were at least partially contained in the cerium hydroxide particles, it was confirmed that the cerium hydroxide particles contained cerium hydroxide. These results confirmed that the cerium hydroxide contained a hydroxide ion bonded to a cerium element.

Preparation of Slurry

Example 1

While stirring at a rotation speed of 300 rpm using a stirring blade of two blades, 175 g of the cerium hydroxide slurry and 125 g of ion-exchange water were mixed to obtain a mixed liquid. Subsequently, after mixing 200 g of the cerium oxide slurry A in the mixed liquid while stirring the mixed liquid, stirring was performed while being irradiated with ultrasonic waves using an ultrasonic cleaner (device name: US-105) manufactured by SND Co., Ltd. Thereby, a test slurry containing composite particles including cerium oxide particles and cerium hydroxide particles that were in contact with the cerium oxide particles (content of cerium oxide particles: 2.0% by mass, content of cerium hydroxide particles: 0.35% by mass) was prepared.

Example 2

The same operation as in Example 1 was performed, except that the amount of the cerium hydroxide slurry used was changed, and thereby a test slurry containing composite particles including cerium oxide particles and cerium hydroxide particles in contact with the cerium oxide particles (content of cerium oxide particles: 2.0% by mass, content of cerium hydroxide particles: 0.3% by mass) was prepared.

Example 3

Cerium oxide particles (cerium oxide particles B different from the cerium oxide particles A) and trade name; ammonium dihydrogen phosphate manufactured by Wako Pure Chemical Industries, Ltd. (molecular weight: 97.99) were mixed to prepare a cerium oxide slurry B (pH: 7) containing 5.0% by mass (solid content amount) of cerium oxide particles. The mixing amount of the ammonium dihydrogen phosphate was adjusted to 1% by mass on the basis of the total amount of the cerium oxide particles. Similarly to the cerium oxide slurry A, the average particle size and the zeta potential of the cerium oxide particles in the cerium oxide slurry B were measured, and the average particle size and the zeta potential were 148 nm and −55 mV, respectively.

While stirring at a rotation speed of 300 rpm using a stirring blade of two blades, 150 g of the cerium hydroxide slurry and 150 g of ion-exchange water were mixed to obtain a mixed liquid. Subsequently, after mixing 200 g of the cerium oxide slurry B in the mixed liquid while stirring the mixed liquid, stirring was performed while being irradiated with ultrasonic waves using an ultrasonic cleaner (device name: US-105) manufactured by SND Co., Ltd. Thereby, a test slurry containing composite particles including cerium oxide particles and cerium hydroxide particles that were in contact with the cerium oxide particles (content of cerium oxide particles: 2.0% by mass, content of cerium hydroxide particles: 0.3% by mass) was prepared.

Example 4

The same operation as in Example 3 was performed, except that the amount of the cerium hydroxide slurry used was changed, and thereby a test slurry containing composite particles including cerium oxide particles and cerium hydroxide particles in contact with the cerium oxide particles (content of cerium oxide particles: 2.0% by mass, content of cerium hydroxide particles: 0.5% by mass) was prepared.

Example 5

By mixing cerium oxide particles (cerium oxide particles C different from the cerium oxide particles A and B), trade name: polyacrylic acid 5000 (weight average molecular weight: 5000) manufactured by Wako Pure Chemical Industries, Ltd., and ion-exchange water, a cerium oxide slurry C (content of cerium oxide particles: 5.0% by mass) was prepared. The mixing amount of the polyacrylic acid was adjusted to 1% by mass on the basis of the total amount of the cerium oxide particles. Similarly to the cerium oxide slurry A, the average particle size and the zeta potential of the cerium oxide particles in the cerium oxide slurry C were measured, and the average particle size and the zeta potential were 145 nm and −55 mV, respectively.

While stirring at a rotation speed of 300 rpm using a stirring blade of two blades, 150 g of the cerium hydroxide slurry and 150 g of ion-exchange water were mixed to obtain a mixed liquid. Subsequently, after mixing 200 g of the cerium oxide slurry C in the mixed liquid while stirring the mixed liquid, stirring was performed while being irradiated with ultrasonic waves using an ultrasonic cleaner (device name: US-105) manufactured by SND Co., Ltd. Thereby, a test slurry containing composite particles including cerium oxide particles and cerium hydroxide particles that were in contact with the cerium oxide particles (content of cerium oxide particles: 2.0% by mass, content of cerium hydroxide particles: 0.3% by mass) was prepared.

Comparative Example 1

By mixing the cerium oxide slurry C and ion-exchange water, a test slurry containing cerium oxide particles (content of cerium oxide particles: 2.0% by mass) was prepared.

Comparative Example 2

By mixing cerium oxide particles (cerium oxide particles D different from the cerium oxide particles A, B, and C), acetic acid (manufactured by Wako Pure Chemical Industries, Ltd.), and ion-exchange water, a test slurry containing cerium oxide particles (content of cerium oxide particles: 2.0% by mass) was prepared. The mixing amount of the acetic acid was 1.0% by mass on the basis of the total amount of the cerium oxide particles.

Comparative Example 3

By mixing colloidal ceria particles having a primary particle size of 90 nm (cerium oxide particles E different from the cerium oxide particles A, B, C, and D) and ion-exchange water, a test slurry containing cerium oxide particles (content of cerium oxide particles: 2.0% by mass (solid content amount)) was prepared.

Comparative Example 4

By mixing colloidal ceria particles having a primary particle size of 50 nm (cerium oxide particles F different from the cerium oxide particles A, B, C, D, and E) and ion-exchange water, a test slurry containing cerium oxide particles (content of cerium oxide particles: 2.0% by mass (solid content amount)) was prepared.

Average Particle Size of Abrasive Grains

Each of the test slurries mentioned above was introduced in an adequate amount into trade name: MICROTRAC MT3300EXII manufactured by MicrotracBEL Corp., and measurement of the average particle size of the abrasive grains was performed. The displayed average particle size value was obtained as the average particle size (average secondary particle size) of the abrasive grains. The measurement results are shown in Table 1.

Rsp Value

The content of the abrasive grains of the test slurry was adjusted with ion-exchange water as necessary, and thereby a measuring sample having a content of the abrasive grains (the total amount of the abrasive grains) of 2.0% by mass was prepared. Next, 2 mL of the measuring sample was added to an NMR tube, and then the tube was set in a pulsed NMR Particle Interface Characteristic Evaluation Apparatus (manufactured by Nihon Rufuto Co., Ltd., trade name: Acron Area). Then, the pulsed NMR measurement was performed under the following conditions, thereby obtaining the relaxation time Tav (an average value of measurement at five times).

Setting temperature: 25° C.
Number of times of measurement: 5 times
7.5 g of the aforementioned measuring sample was added to a tube having a size of 16 mm (inner diameter)×76 mm length, and then the tube was set in a centrifugal separator (manufactured by Beckman Coulter, Inc., trade name: Optima MAX-TL). Then, centrifugal separation was performed for 50 minutes at a centrifugal acceleration of $2.36 \times 10^5$ G (236228 G) and a setting temperature of 25° C. and then about 4 mL of the supernatant solution was fractionated. Subsequently, the pulsed NMR measurement was performed using the supernatant solution by the same method as the aforementioned method, thereby obtaining the relaxation time Tb.

The Rsp value was calculated from the above Formula (1) using the obtained relaxation times Tav and Tb. The Rsp value is shown in Table 1.

Removal Rate of Coarse Particles (Filtration of Slurry)

The content of the abrasive grains of the test slurry was adjusted with ion-exchange water as necessary, and thereby 200 g of a measuring sample having a content of the abrasive grains (the total amount of the abrasive grains) of 2.0% by mass was prepared. The aforementioned measuring sample was introduced into a cylindrical simple filtration apparatus in which a 47-mmφ disk filter (trade name: SCP-005, filtering material: polypropylene, nominal pore size: 0.5 μm) manufactured by ROKI TECHNO CO., LTD. is set, the measuring sample was then pressure-fed at 0.2 MPa, and thereby the measuring sample (filtrate) passing through the filter was recovered. Without performing a circulation treatment, the filtration was performed by causing the slurry to pass through a single filter once.

(Measurement of Removal Rate)

By adding 10 g of the measuring sample (each measuring sample before and after filtration) and 90 g of ion-exchange water to a 100-mL container, the measuring sample was diluted 10-fold, and then the container was set in a mix rotor. From the viewpoint of adjusting to a range below the measurement limit of the upper limit of the number of coarse particles in the measuring apparatus, the measuring sample was diluted as described above. Next, stirring was performed for 10 minutes at a rotation speed of 100 rpm. Subsequently, the container was gently set in a light interception type liquid-borne particle sensor (device name: KS-71) manufactured by RION Co., Ltd., and then the number of coarse particles (LPC: Large Particle Counts, an average value of measurement at five times) having a size (particle size) of 3 μm or more at each time before and after filtration was measured under the following measurement conditions. The removal rate of coarse particles (Removal rate of coarse particles [%]=(1−(LPC after filtration [number/mL])/(LPC before filtration [number/mL]))×100) was calculated on the basis of the number of coarse particles before and after filtration of the measuring sample. The measurement results are shown in Table 1.

Measurement flow rate: 10 mL/times
Flow rate: 60 mL/min
Number of times of measurement: 5 times Incidentally, as a result of measuring the removal rate of coarse particles under the same conditions as described above with respect to ion-exchange water used in adjustment of the content of the abrasive grains after performing the filtration, it was confirmed that the removal rate of coarse particles was 50% or less, and the content of the coarse particles in the ion-exchange water was small. Thereby, it was confirmed that the LPC is not more overrated than the true value by the coarse particles in the ion-exchange water used in preparation of a measuring sample for the removal rate and mixing of foreign substances adhering to the container.

CMP Evaluation

Ion-exchange water was added to the filtrate obtained by performing the same filtration as described above, and thereby a CMP polishing liquid having a content of the abrasive grains (the total amount of the abrasive grains) of 0.1% by mass was obtained. The substrate to be polished was polished by using this CMP polishing liquid under the polishing conditions below.

[CMP Polishing Conditions]

Polishing apparatus: MIRRA (manufactured by Applied Materials, Inc.)

Flow rate of polishing liquid: 200 mL/min

Substrate to be polished: As a blanket wafer having no pattern formed thereon, a substrate to be polished having a silicon oxide film having a thickness of 2 μm, which had been formed by a plasma CVD method, on a silicon substrate was used.

Polishing pad: Foamed polyurethane resin having closed pores (manufactured by Dow Chemical Japan Ltd., Product No.: IC1010)

Polishing pressure: 13 kPa (2.0 psi)

Rotation numbers of substrate to be polished and polishing platen: Substrate to be polished/polishing platen=93/87 rpm Polishing time: 1 minute Washing of wafer: After a CMP treatment, washing was performed with water while applying an ultrasonic wave, and then drying was performed with a spin dryer.

The polishing rate for a silicon oxide film ($SiO_2RR$) that had been polished and washed under the above-described conditions was obtained by the formula below. The results are shown in Table 1. The film thickness difference of the silicon oxide film before and after polishing was obtained using a light interference type film thickness measuring apparatus (trade name: F80 manufactured by Filmetrics Japan, Inc.).

Polishing rate (RR)=(Film thickness difference [nm]
of silicon oxide film before and after polishing)/
(Polishing time: 1 [min])

TABLE 1

|  | Example | | | | | Comparative Example | | | |
|---|---|---|---|---|---|---|---|---|---|
|  | 1 | 2 | 3 | 4 | 5 | 1 | 2 | 3 | 4 |
| Average particle size of abrasive grains (nm) | 155 | 155 | 158 | 158 | 155 | 145 | 140 | 199 | 140 |
| Rsp value | 2.16 | 2.41 | 1.94 | 1.74 | 2.46 | 1.56 | 0.92 | 0.62 | 0.72 |
| Removal rate of coarse particles (%) | 84 | 97 | 90 | 82 | 91 | 32 | 24 | 22 | 20 |
| Polishing rate (nm/min) | 450 | 401 | 410 | 457 | 388 | — | — | — | — |

The invention claimed is:

1. A slurry comprising abrasive grains and a liquid medium, wherein
    the abrasive grains include first particles and second particles in contact with the first particles,
    the first particles contain cerium oxide,
    the second particles contain a cerium compound, and
    an Rsp value calculated by Formula (1) below is 1.60 or more:

$$Rsp = (Tb/Tav) - 1 \quad (1)$$

in the formula, Tav represents a relaxation time (unit: ms) obtained by pulsed NMR measurement of the slurry in a case where a content of the abrasive grains is 2.0% by mass, and Tb represents a relaxation time (unit: ms) obtained by pulsed NMR measurement of a supernatant solution obtained when the slurry is subjected to centrifugal separation for 50 minutes at a centrifugal acceleration of $2.36 \times 10^5$ G in a case where the content of the abrasive grains is 2.0% by mass.

2. The slurry according to claim 1, wherein the cerium compound contains cerium hydroxide.

3. The slurry according to claim 2, wherein a content of cerium hydroxide in the abrasive grains is 3 to 50% by mass on the basis of the entire abrasive grains.

4. The slurry according to claim 2, wherein a particle size of the second particles is 50 nm or less.

5. The slurry according to claim 1, wherein an average particle size of the abrasive grains is 16 to 1050 nm.

6. The slurry according to claim 1, wherein a content of the abrasive grains is 0.01 to 10% by mass.

7. The slurry according to claim 1, wherein a particle size of the first particles is 100 nm or more.

8. The slurry according to claim 1, wherein a particle size of the second particles is smaller than a particle size of the first particles.

9. The slurry according to claim 1, wherein a particle size of the second particles is 30 nm or less.

10. The slurry according to claim 1, wherein an average particle size of the abrasive grains is 120 nm or more.

11. The slurry according to claim 1, wherein a content of cerium oxide in the abrasive grains is 50 to 97% by mass on the basis of the entire abrasive grains.

12. The slurry according to claim 1, wherein a content of the abrasive grains is 0.01 to 5% by mass.

13. A polishing liquid obtained by filtering the slurry according to claim 1.

14. The slurry according to claim 1, wherein a particle size of the second particles is 50 nm or less.

15. The slurry according to claim 1, wherein a particle size of the first particles is 100 nm or more, and a particle size of the second particles is 30 nm or less.

16. A method for producing a polishing liquid, the method comprising a step of filtering the slurry according to claim 1.

17. A polishing method comprising a step of polishing a surface to be polished by using a polishing liquid obtained by the method for producing a polishing liquid according to claim 16.

18. The polishing method according to claim 17, wherein the surface to be polished contains silicon oxide.

* * * * *